(12) United States Patent
Gao (10) Patent No.: US 12,048,126 B2
(45) Date of Patent: Jul. 23, 2024

(54) ENERGY-GENERATING FLUID DISTRIBUTION MODULE FOR SERVERS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

(*) Notice: Subject to any disclaimer, the term of this patent is extended or adjusted under 35 U.S.C. 154(b) by 150 days.

(21) Appl. No.: 17/463,584

(22) Filed: Sep. 1, 2021

(65) Prior Publication Data
US 2023/0066855 A1   Mar. 2, 2023

(51) Int. Cl.
H05K 7/20   (2006.01)

(52) U.S. Cl.
CPC ..... *H05K 7/20781* (2013.01); *H05K 7/20254* (2013.01); *H05K 7/20263* (2013.01); *H05K 7/20272* (2013.01)

(58) Field of Classification Search
CPC .......... H05K 7/20781; H05K 7/20254; H05K 7/20263; H05K 7/20272; H05K 7/20281; H05K 7/20218; H05K 7/1488; H05K 7/20563; H05K 7/20572; H05K 7/20581; H05K 7/2059; H05K 7/206; H05K 7/20609; H05K 7/20608; H05K 7/20618; H05K 7/20627; H05K 7/20636; H05K 7/20645; H05K 7/20654; H05K 7/20663; H05K 7/20672; H05K 7/20681; H05K 7/2069; H05K 7/207; H05K 7/20709; H05K 7/20718; H05K 7/20727; H05K 7/20736; H05K 7/20745; H05K 7/20754; H05K 7/20763; H05K 7/20772; H05K 7/2079; H05K 7/208; H05K 7/20809;
(Continued)

(56) References Cited

U.S. PATENT DOCUMENTS

| | | | | |
|---|---|---|---|---|
| 2007/0227709 A1* | 10/2007 | Upadhya | ............ | H05K 7/20154 165/80.4 |
| 2008/0084664 A1* | 4/2008 | Campbell | ................. | G06F 1/20 361/699 |

(Continued)

FOREIGN PATENT DOCUMENTS

KR   2083611 B1 *   3/2020   .............. F25B 21/02

OTHER PUBLICATIONS

Kang Jong Hyun; Lee Un Hak, 'Heat Conversion Device', Mar. 2, 2020, LG Innotek Co. LTD, Entire Document (Translation of KR 102083611) (Year: 2020).*

*Primary Examiner* — Stephen S Sul
*Assistant Examiner* — Jeffrey F Stoll
(74) *Attorney, Agent, or Firm* — WOMBLE BOND DICKINSON (US) LLP (57) ABSTRACT

Embodiments are disclosed of a fluid distribution apparatus. The fluid distribution apparatus includes a hot manifold including a hot chamber fluidly coupled to one or more fluid return inlets and a main fluid return outlet, and a cold manifold including a cold chamber fluidly coupled to a main fluid supply inlet and one or more fluid supply outlets. A thermoelectric device is sandwiched between the hot manifold and the cold manifold so that the thermoelectric device is in thermal contact with the hot chamber and in thermal contact with the cold chamber. The apparatus is connected to either a server energy storage unit or a rack mounted energy unit through dedicated busbar.

18 Claims, 5 Drawing Sheets

(58) Field of Classification Search
CPC ........... H05K 7/20818; H05K 7/20827; H05K 7/2036; G06F 1/20
See application file for complete search history.

(56) References Cited

U.S. PATENT DOCUMENTS

| | | | | |
|---|---|---|---|---|
| 2009/0155117 | A1* | 6/2009 | Rubio | B01J 3/08 |
| | | | | 419/66 |
| 2010/0043858 | A1* | 2/2010 | Matsui | H10N 10/10 |
| | | | | 361/689 |
| 2010/0051081 | A1* | 3/2010 | Iida | C04B 35/6261 |
| | | | | 423/349 |
| 2012/0024501 | A1* | 2/2012 | Campbell | H05K 7/20236 |
| | | | | 165/104.33 |
| 2012/0096871 | A1* | 4/2012 | Wang | F25B 21/02 |
| | | | | 62/3.2 |
| 2012/0279233 | A1* | 11/2012 | Chainer | H05K 7/20254 |
| | | | | 62/3.6 |
| 2014/0332048 | A1* | 11/2014 | Gauzer | H10N 10/13 |
| | | | | 136/205 |
| 2015/0075186 | A1* | 3/2015 | Prajapati | F25B 21/02 |
| | | | | 62/3.7 |
| 2016/0049569 | A1* | 2/2016 | Negrin | G06F 1/163 |
| | | | | 320/101 |
| 2017/0013746 | A1* | 1/2017 | Campbell | H05K 7/20736 |
| 2021/0378132 | A1* | 12/2021 | Iyengar | G06F 1/188 |
| 2022/0078948 | A1* | 3/2022 | Hsu | B60L 53/50 |

* cited by examiner

ENERGY-GENERATING FLUID DISTRIBUTION MODULE FOR SERVERS

TECHNICAL FIELD

The disclosed embodiments relate generally to liquid-cooling systems for servers and in particular, but not exclusively, to an energy-generating fluid distribution module used with servers in an information technology (IT) rack of the kind found in data centers.

BACKGROUND

Modern data centers like cloud computing centers house enormous amounts of information technology (IT) equipment: servers, blade servers, routers, edge servers, power supply units (PSUs), battery backup units (BBUs), etc. These individual pieces of IT equipment are typically housed in racks within the computing center, with multiple pieces of IT equipment in each rack, and the racks are typically grouped into clusters.

As IT equipment has become more computationally powerful it also consumes more electricity and, as a result, generates more heat. This heat must be removed from the IT equipment to keep it operating properly. Extracting the heat from the IT equipment to the atmosphere can also consume large amounts of energy. To keep up with this increasing need for heat removal, IT equipment has incorporated internal liquid cooling systems and, at the same time, the IT racks in which IT equipment is housed have incorporated rack-level liquid cooling systems that interface with the internal liquid cooling systems of the IT equipment.

Liquid-cooling systems commonly include a fluid distributor that distributes cool fluid to heat-generating components in the IT equipment and collects hot fluid from the heat-generating components such as processors. For existing fluid distributors, fluid collection and distribution are their only functions, but using the fluid distributors this way leads to a major heat loss unit which may impact the overall efficiency.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIGS. 2A-2B are side views of an embodiment of an energy-generating fluid distribution module.

FIGS. 4A-4B are views of an embodiment of rack that can be used with server implementations such as the one shown in FIG. 3.

DETAILED DESCRIPTION

Embodiments are described of an energy-generating fluid distribution module for use with a piece of information technology (IT) equipment such as a server in an IT rack. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments. As used in this application, directional terms such as "front," "rear," "top," "bottom," "side," "lateral," "longitudinal," etc., refer to the orientations of embodiments as they are presented in the drawings, but any directional term should not be interpreted to imply or require a particular orientation of the described embodiments when in actual use.

Embodiments are described of an advanced distributor package that enables high-efficiency reuse of thermal energy, thus increasing overall system performance and efficiency. The fluid distributor benefits both the individual servers and the data center, including both power and cooling systems. The described embodiments enable multiple functions and advanced features for designing and implementing server liquid cooling. The solution not only enables more advanced operation of the server liquid cooling system, but also significantly increases the cooling and power systems efficiency for servers and racks.

The described embodiments include an advanced fluid distributor for server liquid cooling, server design, and rack power system design. The fluid distributor includes a supply distributor and a return distributor packaged together, with a thermoelectric device (TED) sandwiched between the distributors. The supply side is on the cold side of the TED and the return side is on the hot side of the TED. In different embodiments, electric wires can be connected to the TED and to a built in server energy storage unit, or can be connected to a power connector and then connected to a dedicated rack busbar. The dedicated busbar can also be connected to a rack battery backup unit (BBU) unit. The TED enables the temperature difference between the supply and return distributors to be converted to electrical energy and stored within the IT system, so that both the cooling system and power system are improved in servers and data centers. In addition, the overall system reliability is increased with the high temperature being reduced during energy generation. The disclosed embodiments also have the following features:

High efficiency design and ease of implementation.
Significantly increase server operation efficiency.
Improve Internet Data Center (IDC) cooling efficiency.
Compatible with existing rack and IDC systems, both cooling and power.
Compatible with rack BBU architectures.
Compatible with existing hardware design of fluid management units.
Cooling and power co-design to enable peak efficiency.
Self-regulating hardware design.
Enable power generated using thermal energy from IT system to decrease carbon emission.
Compatible with most server architectures.

Figure 1:
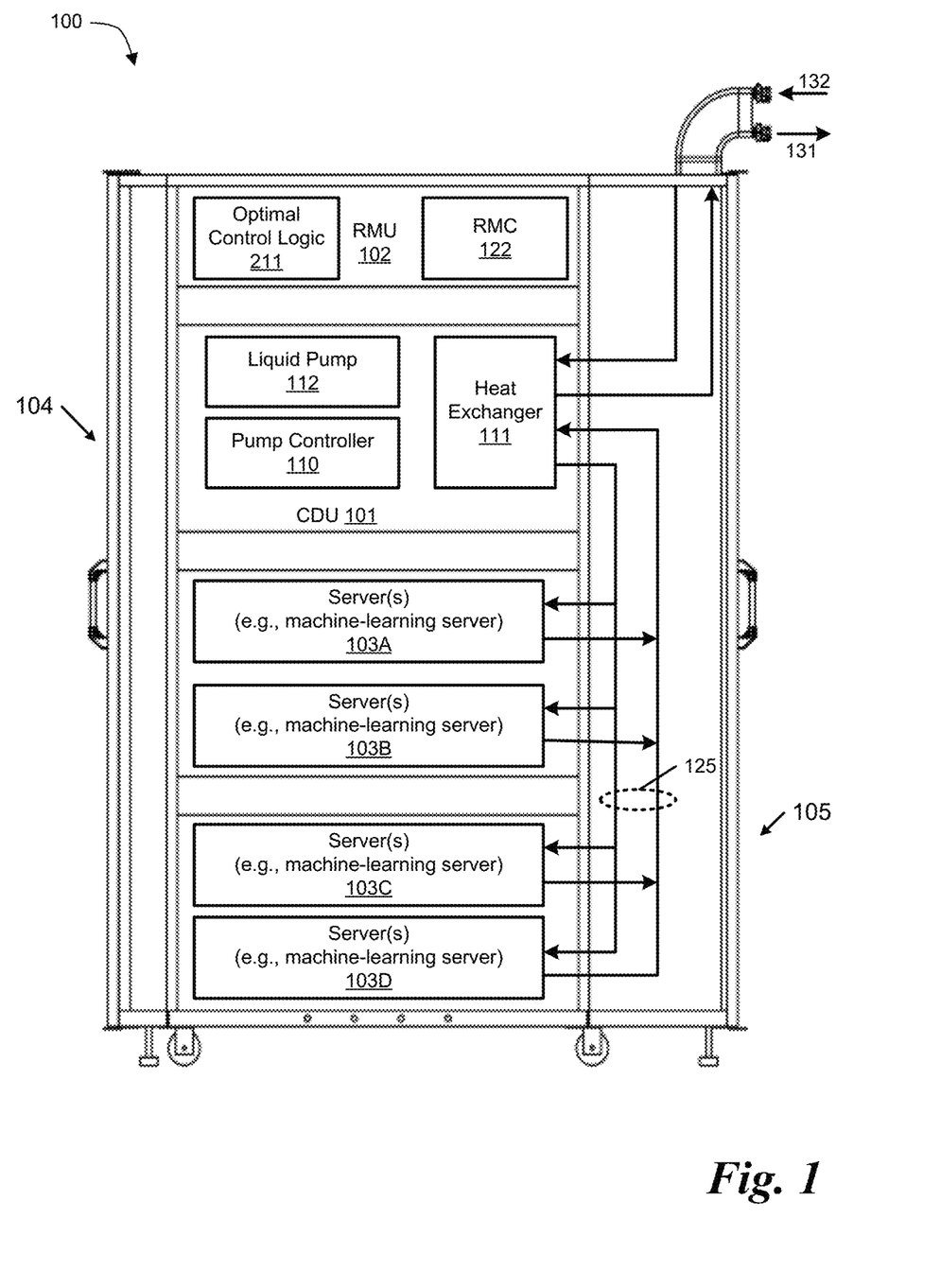
FIG. 1 is a side view of an embodiment of a liquid-cooled information technology (IT) rack populated with various pieces of IT equipment.

FIG. 1 is a block diagram illustrating a side view of an embodiment of an information technology (IT) rack, which is a type of IT container commonly used in data centers. In one embodiment, electronic rack 100 includes CDU 101, rack management unit (RMU) 102, and one or more server blades 103A-103D, collectively referred to as server blades 103. Server blades 103 can be inserted into an array of server slots respectively from front end 104 of electronic rack 100. Note that although only four server blades 103A-103D are shown, more or fewer server blades can be maintained within electronic rack 100. Also note that the particular positions of CDU 101, CMU 102, and server blades 103 are shown for the purpose of illustration only; other arrangements or configurations of CDU 101, CMU 102, and server blades 103 can also be implemented. Further, the front door disposed on front end 104 and the back door disposed on back end 105 are optional. In some embodiments, there can optionally be no door on front end 104 and/or back end 105.

In one embodiment, CDU 101 includes heat exchanger 111, liquid pump 112, and pump controller 110. Heat exchanger 111 can be a liquid-to-liquid heat exchanger. Heat exchanger 111 includes a first tube having a first pair of liquid connectors coupled to external liquid supply/return lines 131-132 to form a primary loop, where the connectors coupled to the external liquid supply/return lines 131-132 can be disposed or mounted on back end 105 of electronic rack 100. In addition, heat exchanger 111 further includes a second tube having a second pair of liquid connectors coupled to liquid manifold 125, which can include a supply manifold to supply cooling liquid to server blades 103 and a return manifold to return warmer liquid back to CDU 101. The processors can be mounted on the cold plates, where the cold plates include a liquid distribution channel embedded therein to receive the cooling liquid from the liquid manifold 125 and to return the cooling liquid carrying the heat exchanged from the processors back to the liquid manifold 125. Rack 100 is an example of an IT rack in which embodiments of a fluid distribution module, such as the ones shown in FIGS. 2A-2B et seq., can be used.

Each server blade 103 can include one or more IT components (e.g., CPUs, GPUs, memory, and/or storage devices). Each IT component can perform data processing tasks, where the IT component can include software installed in a storage device, loaded into the memory, and executed by one or more processors to perform the data processing tasks. Server blades 103 can include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which can generate heat during the operations.

Electronic rack 100 further includes RMU 102 configured to provide and manage power supplied to server blades 103 and CDU 101. RMU 102 can be coupled to a power supply unit (not shown) to manage the power consumption of the power supply unit, as well as other thermal management of the power supply unit (e.g., cooling fans). The power supply unit can include the necessary circuitry (e.g., an alternating current (AC) to direct current (DC) or DC to DC power converter, battery, transformer, or regulator, etc.) to provide power to the rest of the components of electronic rack 100.

In one embodiment, RMU 102 includes optimal control logic 111 and rack management controller (RMC) 122. The optimal control logic 111 is coupled to at least some of server blades 103 to receive operating status of each of the server blades 103, such as processor temperatures of the processors, the current pump speed of the liquid pump 112, and liquid temperature of the cooling liquid, etc. Based on this information, optimal control logic 111 determines an optimal pump speed of the liquid pump 112 by optimizing a predetermined objective function, such that the output of the objective function reaches the maximum while a set of predetermined constraints is satisfied. Based on the optimal pump speed, RMC 122 is configured to send a signal to pump controller 110 to control the pump speed of liquid pump 112 based on the optimal pump speed.

Figure 2A:
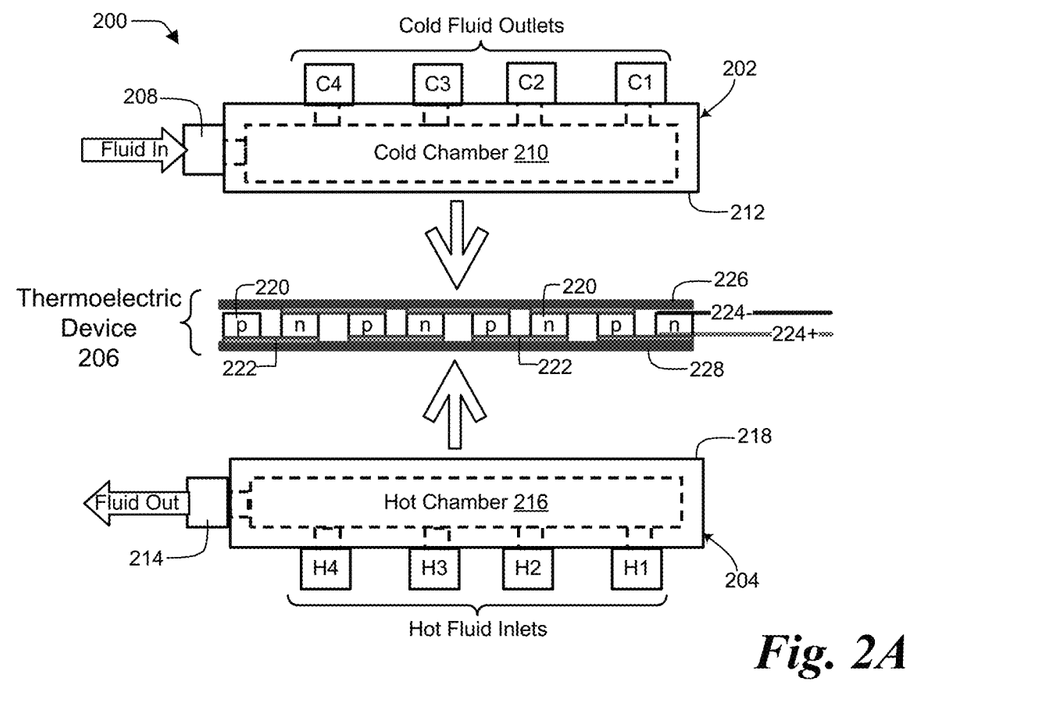
FIG. 2A is an exploded view, FIG. 2B an assembled view.
Figure 2B:
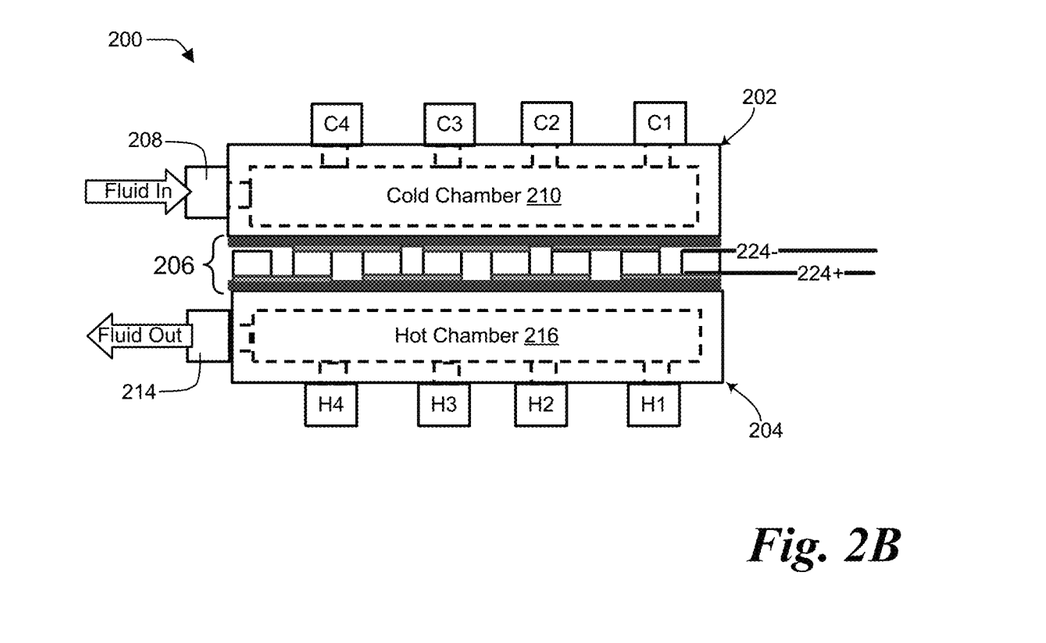

FIGS. 2A-2B together illustrate an embodiment of an energy-generating fluid distribution module 200 that can be coupled with a piece of information technology (IT) equipment such as a server to generate electricity while cooling heat-generating components on the server, such as processors, memory, graphics processing units, etc. FIG. 2A is an exploded view, FIG. 2B an assembled view.

Cooling module 200 includes three primary components: a cold manifold 202, a hot manifold 204, and a thermoelectric device (TED) 206 sandwiched between the cold manifold and the hot manifold.

Cold manifold 202 functions as a fluid supply distributor and includes a main inlet 208 fluidly coupled to an internal cold chamber 210. The main inlet is used for connecting with a rack connector in one embodiment (see FIG. 3). Cold chamber 210 is also fluidly coupled to one or more fluid outlets; in the illustrated embodiment the cold chamber is fluidly coupled to four fluid outlets C1-C4, but other embodiments of cold manifold 202 can include more or less fluid outlets than shown. In embodiments with multiple fluid outlets C, not all the fluid outlets need be used; for instance, if manifold 202 has four fluid outlets C1-C4 but only two are needed, the other two can be capped or otherwise sealed off. In one embodiment, the fluid outlets are designed with dripless quick disconnects so that they are automatically sealed off if not engaged with other connectors. Cold chamber 210 is also in thermal contact with mating surface 212, meaning that heat can be transferred through mating surface 212 into fluid within cold chamber 210. In one embodiment of cold manifold 202, at least mating surface 212 is made of material with high thermal conductivity to aid heat transfer in and out of cold chamber 210; the material can be a metal or a non-metal with high thermal conductivity. In some embodiments mating surface 212 can be made of the same material as the rest of cold manifold 202, but in other embodiments the mating surface can be made of a different material than the rest of the manifold.

Hot manifold 204 functions as a fluid return collector and includes a main outlet 214 fluidly coupled to an internal hot chamber 216. The main outlet is used for connecting with a rack connector in one embodiment (see FIG. 3). Hot chamber 216 is also fluidly coupled to one or more fluid inlets H. In the illustrated embodiment the hot chamber is fluidly coupled to four fluid inlets H1-H4, but other embodiments of hot manifold 204 can include more or less fluid inlets than shown. In embodiments with multiple fluid inlets H not all the fluid inlets need be used; for instance, in an embodiment where manifold 204 has four fluid inlets but only two are needed, the other two can be capped or otherwise sealed off.

In one embodiment, the fluid inlets are equipped with blind mating connectors. Hot chamber 216 is also in thermal contact with mating surface 218, meaning that heat can be transferred through mating surface 218 from fluid within hot chamber 218. In one embodiment of hot manifold 204, at least mating surface 218 is made of material with high thermal conductivity to aid heat transfer out of hot chamber 216; the material can be a metal or a non-metal with high thermal conductivity. In some embodiments mating surface 218 can be made of the same material as the rest of hot manifold 204, but in other embodiments the mating surface can be made of a different material than the rest of the manifold.

Thermoelectric device (TED) 206 includes multiple semiconductor pillars 220 that are electrically connected in series by conductors 222. Semiconductor pillars 220 include alternating p-type and n-type semiconductors electrically connected in series by conductors 222. In one embodiment semiconductors that include different trivalent impurities and pentavalent impurities can be used. The multiple semiconductor pillars 220 are sandwiched between a pair of electrically-insulating layers 226 and 228. In one embodiment, insulating layers 226 and 228 can be made of materials that are thermally conductive but electrically insulating, but other materials can be used in other embodiments. In the illustrated embodiment, TED 206 is shown as a single unit, but in other embodiments TED 206 can be a TED assembly that includes multiple individual TEDs connected in series. In an embodiment with a TED assembly made up of multiple individual TEDs, the semiconductor pillars in individual TEDs can use different types of impurities—one individual TED can use trivalent impurities, another individual TED can use pentavalent impurities, yet another individual TED can use both trivalent and pentavalent impurities, and so on—so that the TED assembly can be tailored to improve electrical generation.

A pair of electrical leads or wires 224, which includes a positive lead 224+ and a negative lead 224−, are electrically coupled to thermoelectric device 206. Thermoelectric device 206 can operate in two modes. In principle, if electricity is supplied to thermoelectric device 206 through leads 224 (i.e., if TED 206 consumes electricity), it operates as a thermoelectric cooler (TEC) that creates a heat flux. If no electricity is supplied to TED 206 but a heat flux is applied across the TED, the device generates electricity—i.e., it operates as a thermoelectric generator. In the illustrated embodiment, thermoelectric device 206 acts as a thermoelectric generator, as further explained below. Although illustrated as a single thermoelectric device, other embodiments of fluid distribution module 200 can include multiple thermoelectric devices between the hot and cold manifolds. Thermoelectric devices are commercially available.

To assemble fluid distribution module 200, thermoelectric device 206 is sandwiched between cold manifold 202 and hot manifold 204. In one embodiment, to improve heat transfer, hot manifold 204 is below the thermoelectric device and cold manifold 202 is above the thermoelectric device. Cold manifold 202 is coupled to thermoelectric device 206 such that mating surface 212 is in thermal contact with insulating layer 226—i.e., positioned so that heat can travel from one to the other. In one embodiment mating surface 212 can be positioned in direct contact with insulating layer 226, with nothing intervening between them, but in other embodiments material such as a thermal interface material (TIM) can be put between mating surface 212 and insulating layer 226.

Similarly, hot manifold 204 is coupled to thermoelectric device 206 such that mating surface 218 is in thermal contact with insulating layer 228—i.e., positioned so that heat can travel from one to the other. In one embodiment mating surface 218 can be positioned in direct contact with insulating layer 228 with nothing intervening between them, but in other embodiments material such as a thermal interface material (TIM) can be put between mating surface 218 and insulating layer 228. In some embodiments cold manifold 202 and hot manifold 204 need not be thermally coupled to thermoelectric device 206 in the same way. For instance, in some embodiments mating surface 212 can be put directly on insulating layer 226 while mating surface 218 is thermally coupled to insulating layer 228 with a thermal interface material. An embodiment of the operation of fluid distribution module 200 is described below in connection with FIG. 3.

During operation, the cold chamber receives cooling fluid and the hot chamber receives hot fluid. The temperature difference between the core chamber and the hot chamber enables the TED to generate electricity converting from the heat. In this design, a portion of the thermal load does not end up in the cooling system, but rather is stored in the energy storage unit in the system.

Figure 3:
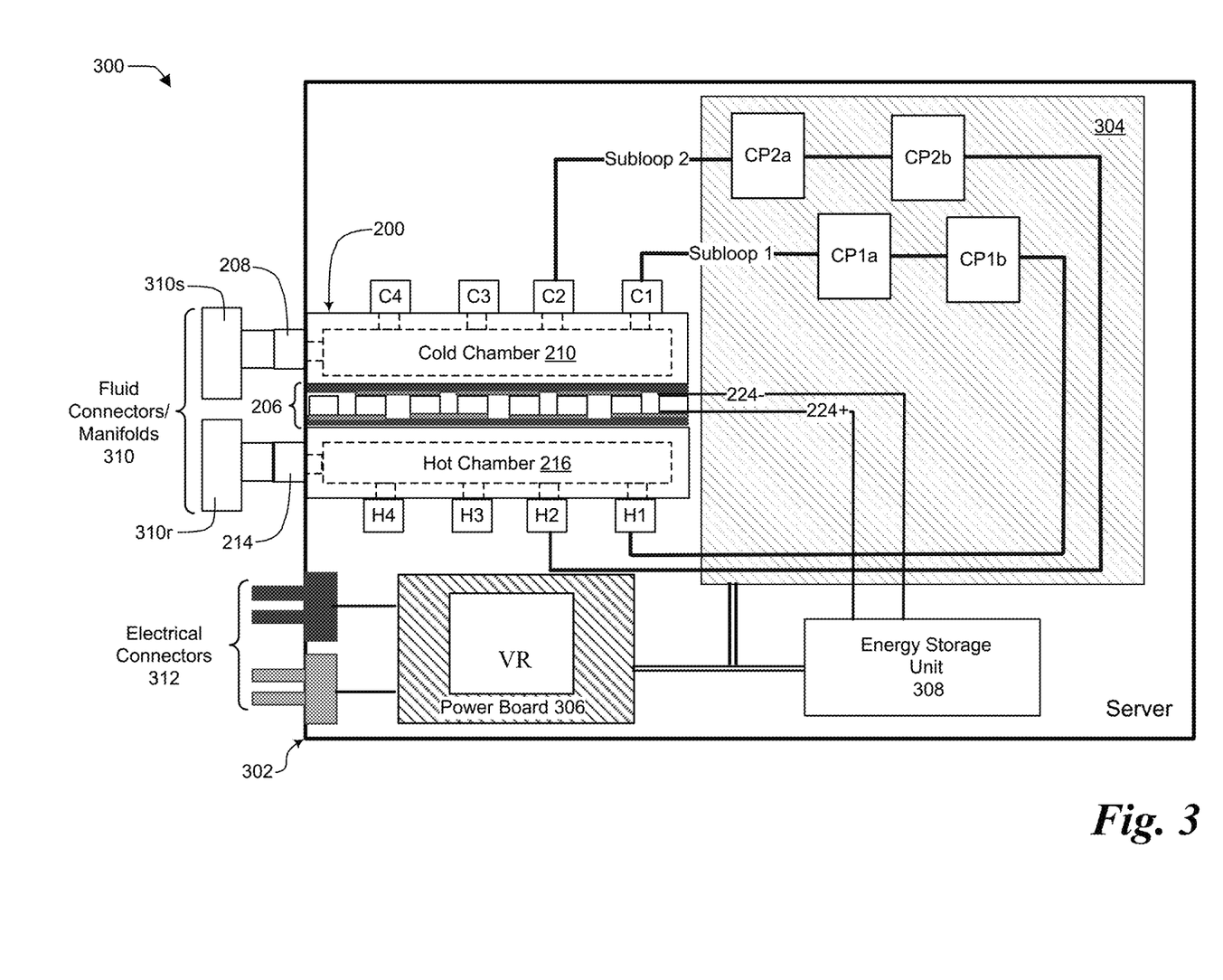
FIG. 3 is a plan view of an embodiment of a server schematic representation of an energy-generating fluid distribution module such as the one shown in FIGS. 2A-2B.

FIG. 3 illustrates a server implementation 300 of an embodiment fluid distribution module 200. Server 300 includes a housing 302 within which are housed at least one fluid distribution module 200, at least one circuit board 304, a power board 306, and an energy storage unit 308. Circuit board 304 is electrically coupled to power board 306 and energy storage unit 308, while liquid-cooling components on circuit board 304 are fluidly coupled to fluid distribution module 200.

Fluid distribution module 200 is positioned within the housing in a location where it can be connected to a set of fluid connectors 310 that includes a fluid supply 310s and a fluid return 310r. In one embodiment fluid connectors 310 can be rack fluid connectors (i.e., they are part of the rack in which server 300 is housed; see, e.g., FIG. 1), but in other embodiments fluid connectors 310 can be facility connectors (i.e., they are part of the facility in which the server is housed, so that fluid distribution module 200 is fluidly coupled to the facility rather than to an intervening structure such as a rack). In the illustrated embodiment, cold chamber 210 is fluidly coupled to fluid supply 310s by main inlet 208, while hot chamber 216 is fluidly coupled to fluid return 310r by main outlet 214.

Circuit board 304 has mounted thereon one or more heat-generating components used to operate the server. Examples of heat-generating components that can be found on circuit board 304 include microprocessors (e.g., CPUs), graphics processing units (GPUs), volatile and non-volatile memory, and so on. At least one of the one or more heat-generating components is thermally coupled to a cooling device such as a cold plate to transfer heat from the heat-generating components into fluid flowing through the cold plate. Each cold plate has a fluid inlet through which cooling fluid enters the cold plate and a fluid outlet through which cooling fluid exits the cold plate. The illustrated embodiment of server 300 includes four cold plates (CP1a, CP1b, CP2a, and CP2b) and every heat-generating component is thermally coupled to a cold plate, but other embodiments can include more or less cold plates than shown, and in still other embodiments not every heat-generating component need be thermally coupled to a cold plate. In still other embodiments, cooling devices other than cold plates can be used.

To cool the heat-generating components mounted on board 304, cold plates are thermally coupled to their respective components and fluidly coupled to fluid distribution module 200 to form one or more fluid subloops; they are described here as fluid subloops because they are part of a larger fluid loop that can include fluid distribution module 200, the rack in which server 300 is located, and the facility in which the rack is located. In the illustrated embodiment, a first subloop, subloop 1, is formed by fluidly coupling outlet C1 to cold plates CP1a and CP1b and to return inlet H1. Similarly, a second subloop, subloop 2, is formed by fluidly coupling supply outlet C2 to cold plates CP2a and CP2b and to return inlet H2. Other embodiments can, of course, have more or less subloops than shown.

In the illustrated embodiment each subloop has two cold plates and in each subloop the cold plates are connected in series, with the outlet of a cold plate connected to the inlet of the next cold plate downstream (e.g., the outlet of CP2a is fluidly coupled to the inlet of CP2b). But other embodiments can include more or less cold plates in each subloop than shown, and in subloops with more than one cold plate the cold plates need not be fluidly coupled in series. For a given temperature difference between hot chamber 216 and cold chamber 210, a higher temperature in the hot chamber will result in greater and more efficient electrical generation from the TED, so that it can be advantageous for the temperature of fluid in the hot chamber to be as high as possible. To increase the temperature in hot chamber 216, in some embodiments, in addition to coupling the cold plates in series it can be advantageous to position cold plates that are thermally coupled to heat-generating components with higher design and operating temperatures furthest downstream in the subloop (i.e., closest to inlets H1-H4) and to position cold plates coupled to heat-generating components with lower design and operating temperatures further upstream in the subloop (i.e., closer to outlet C1-C4). Also in the illustrated embodiment, in each subloop each supply outlet C is fluidly coupled to a corresponding return inlet H: C1 is fluidly coupled to H1, C2 is fluidly coupled to H2, and so on. But in other embodiments subloops can share supply outlets, share return inlets, or share both, so that there need not be a one-to-one correspondence between supply outlets C and return inlets H.

Power board 306 is electrically coupled to a rack busbar (not shown in this figure, but see FIGS. 4A-4B) by electrical connectors 312 and is also electrically coupled to circuit board 304 and to energy storage unit 308, so that during operation power board 306 can provide electrical power to the components on circuit board 304 and can charge energy storage unit 308. Power board 306 can include components that condition the electrical energy received through electrical connectors 312 so that it can be used by components on circuit board 304 and can be directed to energy storage unit 308. In the illustrated embodiment, for instance, power board 306 includes a voltage regulator (VR), but other embodiments of power board 306 can include additional or different electrical conditioning components such as transformers, rectifiers, and the like. Both power board 306 and energy storage unit 308 can supply DC power to circuit board 304.

In addition to being thermally coupled to cold chamber 210 and hot chamber 216, thermoelectric device 206 within fluid distribution module 200 is also electrically coupled by electrical connections 224+ and 224− to energy storage unit 308. During operation, cool fluid enters cold chamber 210, flows through the cold plates in each subloop, and returns heated to hot chamber 216. Heat flux between hot chamber 216 and cold chamber 210 goes through thermoelectric device 206, generating electricity that is transferred by electrical connections 224+ and 224− to energy storage unit 308. Thermoelectric device 206 thus uses the temperature difference between hot chamber 216 and cold chamber 210 to convert heat energy, which would otherwise be wasted, into electricity that can be stored in energy storage unit 308. In addition to reclaiming heat energy that would otherwise be wasted, the illustrated embodiment has the advantage that energy transferred from hot chamber 216 to cold chamber 210 reduces the temperature of fluid exiting through main outlet 214 to return connectors 310r. This temperature reduction, which can be significant, results in cooler fluid returning to the rack and the facility, reducing the amount of heat load that needs to be removed by the rack and/or the data center cooling facility.

Figure 4A:
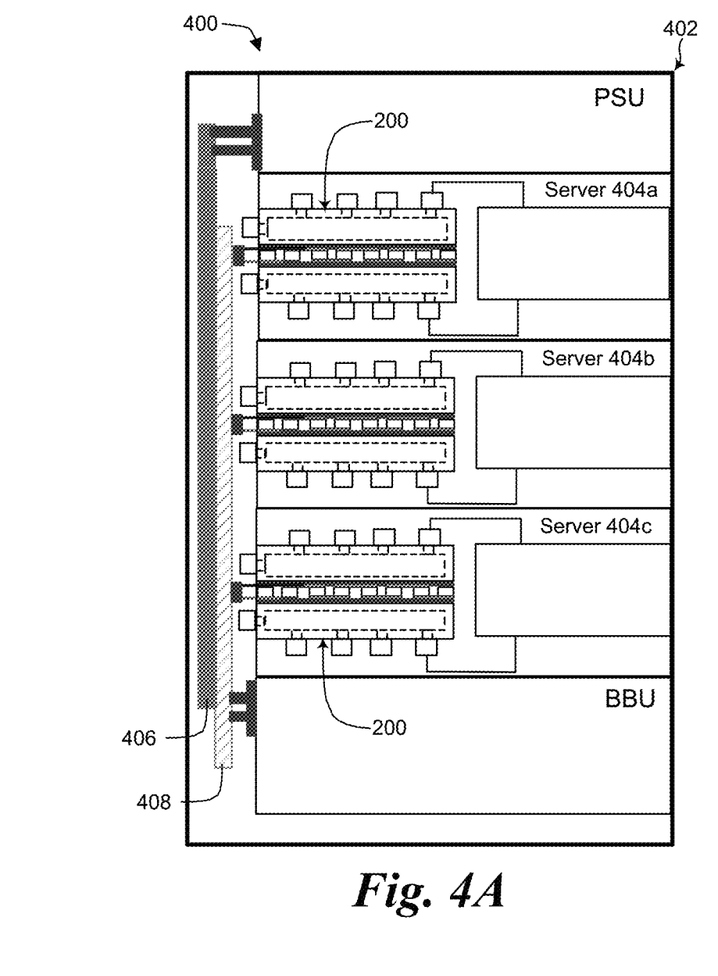
FIG. 4A is a side view, FIG. 4B a rear view.
Figure 4B:
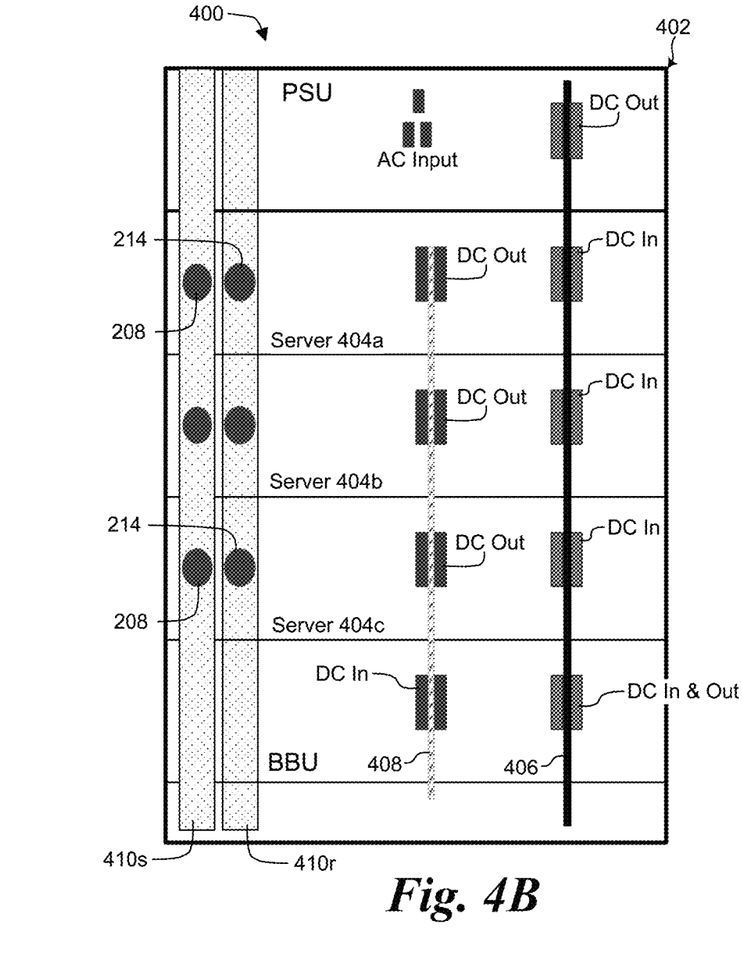

FIGS. 4A-4B together illustrate an embodiment of a rack implementation 400 of fluid distribution module 200. FIG. 4A is a side view, FIG. 4B a rear view. Rack implementation 400 differs from the server implementation 300 primarily in one respect: instead of using individual energy storage devices 308 in each server as shown in FIG. 3, the rack implementation uses a rack energy storage device, such as a battery backup unit (BBU), to service multiple servers.

Rack implementation 400 includes a rack 402 within which are positioned one or more pieces of information technology (IT) equipment. In the illustrated embodiment the IT equipment includes a power supply unit (PSU), servers 404, and a battery backup unit (BBU), but other embodiments can include different IT equipment than shown. The illustrated embodiment includes three servers 404a-404c, but other embodiments can include more or less servers than shown, and other embodiments can also include different numbers of PSUs and BBUs than shown. In the illustrated embodiment all three servers 404a-404c include a fluid distribution module 200, but in other embodiments not all servers in rack 400 need include a fluid distribution module 200. In servers 404 that include a fluid distribution module 200 the server is configured substantially as shown in FIG. 3, except that instead of begin electrically connected to an internal energy storage device 308, the thermoelectric device 206 within each fluid distribution module 200 is electrically coupled to a dedicated auxiliary busbar 408.

Rack 402 includes a pair of busbars, including a first or main busbar 406 and a second or auxiliary busbar 408. Main busbar 406 is a traditional busbar used in server racks to provide electrical power to the IT equipment in the rack. For instance, in a server configured like server 300 (see FIG. 3), main busbar 406 would provide electrical power to the server through electrical connectors 312 and power board 306. In the illustrated embodiment, AC power is provided to the PSU through an AC input. The PSU converts AC power to DC power and outputs DC power to main busbar 406. Servers 404a-404c are electrically coupled to main busbar 406, so that they receive DC power from the main busbar. The BBU is also electrically coupled to main busbar 406, so that it can receive DC input from the main busbar when being charged and can deliver DC output to the main busbar, thus powering servers 404a-404c, when it is being discharged.

Auxiliary busbar 408 is a dedicated busbar used for a different purpose than main busbar 406: busbar 408 transmits electricity generated by the thermoelectric device 206 of at least one fluid distribution module 200 to a rack energy storage device such as the BBU. In the illustrated embodiment of rack implementation 400, all thermoelectric devices 206 are electrically coupled to auxiliary busbar 408, and hence electrically coupled to the rack's BBU, instead of being electrically coupled to individual energy storage device 308 within the servers as in server 300. But other embodiments of rack implementation 400 can use both the rack's BBU and an individual energy storage device within each server, in which case each thermoelectric device 206 can be electrically coupled to both the rack's auxiliary busbar 408 and the server's individual energy storage device. The thermoelectric devices 206 can be electrically coupled to the auxiliary busbar using clips similar to the ones used to connect a server to the main busbar (see FIG. 3).

Rack 402 also includes a cooling rack supply manifold 410s and a rack return manifold 410r (seen in FIG. 4B but not FIG. 4A). Rack supply manifold 410s receives cool fluid from the facility and supplies it to the IT equipment in rack 402, while rack return manifold 410r receives hot fluid from the IT equipment in the rack and returns it to the facility. As illustrated in FIG. 3, each fluid distribution module 200 has its cold chamber 210 fluidly coupled to rack supply manifold 410s by main inlet 208 and has its hot chamber 216 fluidly coupled to rack return manifold 410r by main outlet 214, so that the rack supply manifold supplies cool fluid to all fluid distribution modules 200 and the rack return manifold receives hot fluid exiting the fluid distribution modules 200.

The BBU includes two connectors: one is a DC input connector that receives power from an individual server's distribution module, the other a DC input and DC output that connect to the main busbar. This is the main power input and output for the BBU. The PSU functions as the main power source for the entire rack. Rack implementation 400 shows that the servers can function as power generators for the entire rack, while at the same time the design of the fluid distribution module, significantly decreases the heat load going from the servers into the data center cooling system.

Figure 5:
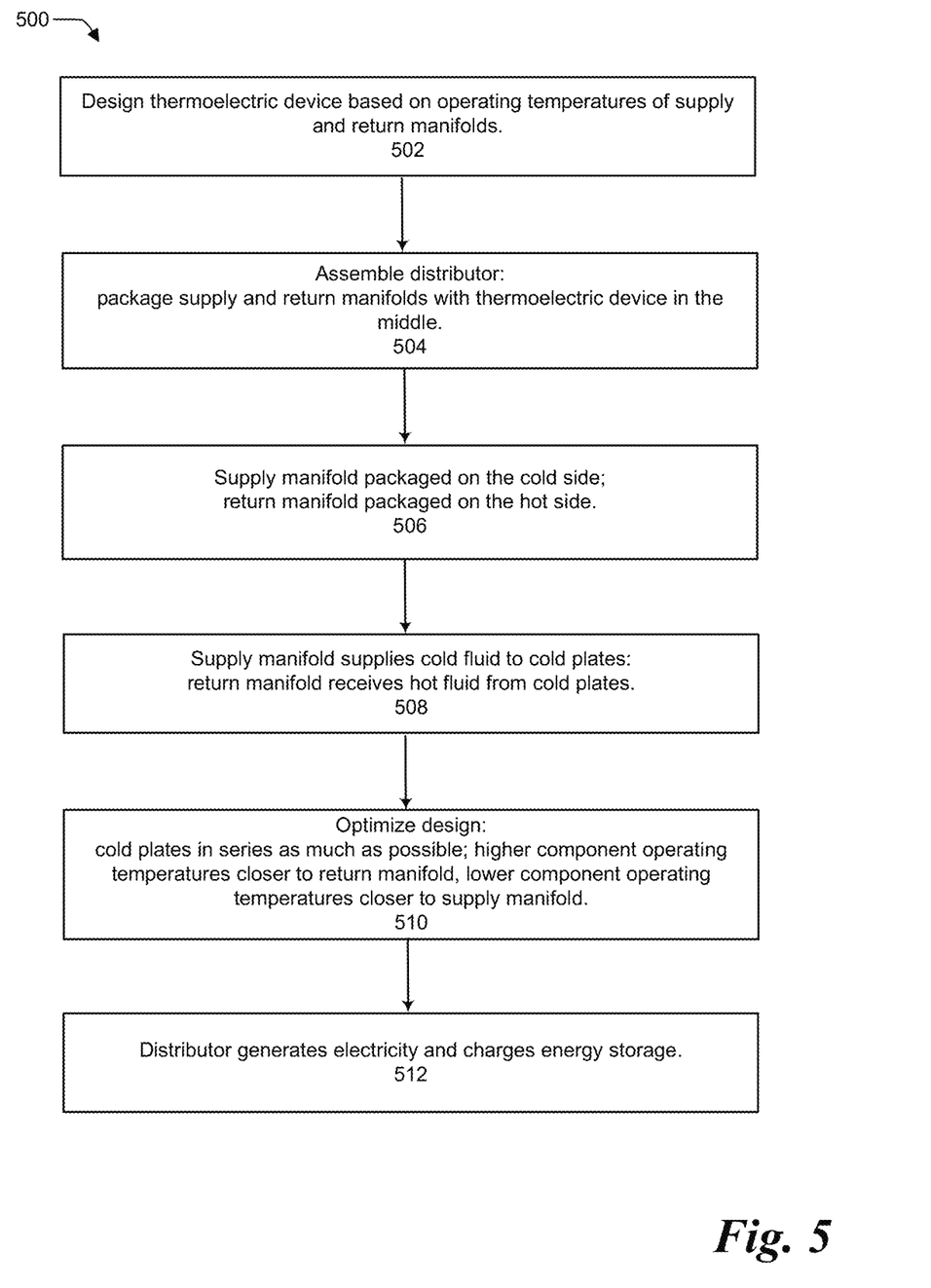
FIG. 5 is a flowchart of an embodiment of a process for assembling, optimizing, and operating a fluid distribution module such as the one shown in FIGS. 2A-2B.

FIG. 5 shows, in flowchart form, the design, packaging, and optimization in actual applications of a distribution module such as distribution module 200. Generally, an optimized design includes co-design of several components: the distribution module, the individual cooling devices (e.g., cold plates), and the method of connecting them; supply and return distributor operating temperatures; thermoelectric device selection and reconfiguration; cooling and power systems; and the server architecture including the chips and integrated circuits cooled by the liquid cooling devices packaged in the server.

At block 502, the thermoelectric device is designed based on the operating temperatures in the supply and return manifolds, and at block 504 the thermoelectric device is packaged into a distribution module by sandwiching it between the supply and return manifolds. As shown in block 506, the supply manifold is packaged on the cold side, so that it supplies cold fluid to cold plates as shown in block 508. Also in block 506, the return manifold is packaged on the hot side, so that it receives hot fluid from cold plates, as shown in block 508.

At block 510 the system designed can be optimized. For instance, for a given temperature difference between hot chamber 216 and cold chamber 210, a higher temperature in the hot chamber will result in greater and more efficient electrical generation from the TED. It can therefore be advantageous for the temperature of fluid in the hot chamber to be as high as possible. To increase the temperature in hot chamber 216 the cold plates coupled to the distribution module can be coupled in series. To further increase the temperature in hot chamber 216, cold plates that are thermally coupled to the heat-generating components with higher design and operating temperatures are positioned closest to the hot chamber (i.e., closest to inlets H1-H4; see FIG. 3). Similarly, heat-generating components with lower design and operating temperatures can be arranged closest to the cold chamber (i.e., closest to outlets C1-C4; see FIG. 3). With the design optimized at block 510, the distributor begins operating at block 512, producing electricity which is used to charge an energy storage device.

Other embodiments are possible besides the ones described above. For instance:

Multiple thermoelectric devices (TEDs) can be packaged between manifolds.

Thermal isolation can be added to the package to enhance performance.

The server and rack design can be different for implementing the solution.

The above description of embodiments is not intended to be exhaustive or to limit the invention to the described forms. Specific embodiments of, and examples for, the invention are described herein for illustrative purposes, but various modifications are possible.

What is claimed is:

1. A fluid distribution apparatus comprising:
   a hot manifold including a hot chamber fluidly coupled to a plurality of fluid return inlets and a main fluid return outlet;
   a cold manifold including a cold chamber fluidly coupled to a main fluid supply inlet and a plurality of fluid supply outlets;
   a thermoelectric device sandwiched between the hot manifold and the cold manifold so that the thermoelectric device is in thermal contact with the hot chamber and in thermal contact with the cold chamber; and
   an energy storage device and an additional energy storage device electrically coupled to the thermoelectric device,
   wherein the energy storage device and the additional energy storage device are adapted to be charged by electricity generated by the thermoelectric device.

2. The fluid distribution apparatus of claim 1 wherein the thermoelectric device is adapted to be electrically coupled to a dedicated rack busbar.

3. The fluid distribution apparatus of claim 1 wherein the thermoelectric device is a thermoelectric assembly including multiple individual thermoelectric devices electrically coupled in series.

4. The fluid distribution apparatus of claim 3 wherein different individual thermoelectric devices of the multiple individual thermoelectric devices use semiconductors pillars with different impurities.

5. The fluid distribution apparatus of claim 1 wherein the main fluid supply inlet is adapted to be coupled to a rack fluid supply and the main fluid return outlet is adapted to be fluidly coupled to a rack fluid return.

6. The fluid distribution apparatus of claim 1 wherein at least one of the plurality of fluid supply outlets and at least one of the plurality of fluid return inlets are adapted to be fluidly coupled to one or more cold plates that are thermally coupled to heat-generating components, wherein the one or more cold plates are coupled in series between at least one of the plurality of fluid supply outlets and at least one of the plurality of fluid return inlets, and wherein, of the one or more cold plates, the cold plates coupled to the heat-generating components that operate at the highest temperatures are positioned closest to at least one of the plurality of fluid return inlets and the cold plates coupled to the heat-generating components that operate at the lowest temperatures are positioned closest to at least one of the plurality of fluid supply outlets.

7. A cooling system comprising:
one or more cold plates adapted to be thermally coupled to a corresponding one of one or more heat-generating components in a piece of information technology (IT) equipment, each cold plate having a fluid inlet and a fluid outlet;
a fluid distributor including:
a hot manifold including a hot chamber fluidly coupled to a plurality of fluid return inlets and a main fluid return outlet,
a cold manifold including a cold chamber fluidly coupled to a main fluid supply inlet and a plurality of fluid supply outlets, and
a thermoelectric device sandwiched between the hot manifold and the cold manifold so that the thermoelectric device is in thermal contact with the hot chamber and in thermal contact with the cold chamber;
an energy storage device located in the piece of IT equipment and electrically coupled to the thermoelectric device and to the one or more heat-generating components and an additional energy storage device, wherein the energy storage device and the additional energy storage device are adapted to be charged by electricity generated by the thermoelectric device; and
one or more cooling loops formed by fluidly coupling at least one of the one or more cold plates to the cold chamber through one of the plurality of fluid supply outlets and to the hot chamber through one of the plurality of fluid return inlets.

8. The cooling system of claim 7, further comprising a power board electrically coupled to the one or more heat-generating components and to the energy storage device.

9. The cooling system of claim 7 wherein in at least one of the one or more cooling loops the cold plates coupled to the heat-generating components that operate at the highest temperatures are positioned closest to the plurality of fluid return inlets.

10. The cooling system of claim 9 wherein in at least one of the one or more cooling loops the cold plates coupled to the heat-generating components that operate at the lowest temperatures are positioned closest to the plurality of fluid supply outlets.

11. The cooling system of claim 7 wherein in at least one of the one or more cooling loops, two or more cold plates are fluidly coupled in series.

12. The cooling system of claim 7 wherein the piece of IT equipment is positioned in a rack and wherein the thermoelectric device is connected to a rack energy storage device through a dedicated rack busbar.

13. A rack comprising:
one or more compartments adapted to receive IT equipment, wherein the IT equipment on the rack in at least one of the one or more compartments includes, either in the same or separate compartments of the one or more compartments: a power supply unit (PSU), a battery backup unit (BBU), and a server including a power board and a liquid cooling system with a fluid distributor, the fluid distributor including:
a hot manifold including a hot chamber fluidly coupled to a plurality of fluid return inlets and a main fluid return outlet,
a cold manifold including a cold chamber fluidly coupled to a main fluid supply inlet and one or more a plurality of fluid supply outlets, and
a thermoelectric device sandwiched between the hot manifold and the cold manifold so that the thermoelectric device is in thermal contact with the hot chamber and in thermal contact with the cold chamber;
a main rack busbar adapted to electrically couple the PSU to the BBU and to the power board of the server; and
an auxiliary rack busbar adapted to electrically couple the thermoelectric device to the BBU, wherein the BBU is adapted to be charged through the auxiliary rack busbar by electricity generated by the thermoelectric device.

14. The rack of claim 13 wherein the liquid cooling system further comprises:
one or more cold plates adapted to be thermally coupled to a corresponding one of one or more heat-generating components in the server, each cold plate having a fluid inlet and a fluid outlet;
one or more cooling loops formed by fluidly coupling at least one of the one or more cold plates to the cold chamber through one of the plurality of fluid supply outlets and to the hot chamber through one of the plurality of fluid return inlets.

15. The rack of claim 14 wherein in at least one of the one or more cooling loops the cold plates coupled to the heat-generating components that operate at the highest temperatures are positioned closest to the plurality of fluid return inlets.

16. The rack of claim 15 wherein in at least one of the one or more cooling loops the cold plates coupled to the heat-generating components that operate at the lowest temperatures are positioned closest to the plurality of fluid supply outlets.

17. The rack of claim 13 wherein the server further includes an energy storage device located in the server and electrically coupled to the thermoelectric device.

18. The rack of claim 13 wherein the rack includes a rack fluid supply connector and a rack fluid return connector, the main fluid supply inlet being adapted to be coupled to the rack fluid supply connector and the main fluid return outlet being adapted to be fluidly coupled to the rack fluid return connector.

* * * * *